(12) United States Patent
Yamada et al.

(10) Patent No.: US 8,008,760 B2
(45) Date of Patent: Aug. 30, 2011

(54) INTEGRATED SEMICONDUCTOR DEVICE

(75) Inventors: Hiroshi Yamada, Kanagawa (JP); Kazuhiko Itaya, Kanagawa (JP); Yutaka Onozuka, Kanagawa (JP); Hideyuki Funaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/370,927

(22) Filed: Feb. 13, 2009

(65) Prior Publication Data
US 2009/0206444 A1 Aug. 20, 2009

(30) Foreign Application Priority Data
Feb. 14, 2008 (JP) ................................. 2008-032594

(51) Int. Cl.
*H01L 23/02* (2006.01)
(52) U.S. Cl. .. 257/678; 257/687; 257/723; 257/E23.003
(58) Field of Classification Search .................. 257/678, 257/687, 692, 700, 723, 725, E23.003, E23.004, 257/E23.007
See application file for complete search history.

(56) References Cited

U.S. PATENT DOCUMENTS

| 6,507,098 B1 * | 1/2003 | Lo et al. .................... 257/686 |
| 6,836,025 B2 * | 12/2004 | Fujisawa et al. ............ 257/782 |
| 6,856,009 B2 * | 2/2005 | Bolken et al. ............... 257/686 |
| 7,518,229 B2 * | 4/2009 | Cotte et al. ................. 257/698 |
| 2007/0273018 A1 | 11/2007 | Onozuka et al. |
| 2008/0318356 A1 | 12/2008 | Onozuka et al. |

FOREIGN PATENT DOCUMENTS

| CN | 1463043 A | 12/2003 |
| JP | 2001-189424 | 7/2001 |
| JP | 2003-298005 | 10/2003 |
| JP | 2005-167191 | 6/2005 |
| JP | 2005-268453 | 9/2005 |
| JP | 2006-245226 | 9/2006 |
| JP | 2007-260866 | 10/2007 |
| WO | WO00/21135 | 4/2000 |

OTHER PUBLICATIONS

U.S. Appl. No. 12/350,927, filed Jan. 8, 2009, Unknown.

* cited by examiner

*Primary Examiner* — Zandra Smith
*Assistant Examiner* — Paul Patton
(74) *Attorney, Agent, or Firm* — Oblon, Spivak, McClelland, Maier & Neustadt, L.L.P.

(57) ABSTRACT

An integrated semiconductor device includes a plurality of semiconductor elements having different integrated element circuits or different sizes; an insulating material arranged between the semiconductor elements; an organic insulating film arranged entirely on the semiconductor elements and the insulating material; a fine thin-layer wiring that arranged on the organic insulating film and connects the semiconductor elements; a first input/output electrode arranged on an area of the insulating material; and a first bump electrode formed on the first input/output electrode.

8 Claims, 6 Drawing Sheets

INTEGRATED SEMICONDUCTOR DEVICE

CROSS-REFERENCE TO RELATED APPLICATIONS

This application is based upon and claims the benefit of priority from the prior Japanese Patent Application No. 2008-32594, filed on Feb. 14, 2008; the entire contents of which are incorporated herein by reference.

BACKGROUND OF THE INVENTION

1. Field of the Invention

The present invention relates to an integrated semiconductor device on which multiple semiconductor chips are mounted.

2. Description of the Related Art

In the recent integrated semiconductor device technology, high-density integration technologies have been progressed, and semiconductor elements that constitute the integrated semiconductor device is required high integration accordingly. Especially in the recent technology for the integrated semiconductor devices, a high integration technology for micro electro mechanical systems (MEMS) is required along with for large-scale integrated (LSI) circuits.

The MEMS include electro mechanical components having a microstructure that is fabricated by silicon micro-fabrication process. The MEMS are expected to apply widely in the field of electronic components such as a pressure sensor, an acceleration sensor, and an RF filter. To integrate the MEMS with LSIs, a high-density three-dimensional packaging technology has been developed as one of MEMS-LSI integration technology, with which the LSIs and MEMS are laminated on one another. In this packaging, however, a vertical through hole has to be formed in the LSIs and the MEMS, which raises the device fabrication cost. Thus, a technology to integrate them on the same plane, which does not need to form the vertical through hole, is required.

The integration technology on a single plane includes two major methods; System on Chip (SOC) and System in Package (SIP). The SOC is a method of packaging by forming multiple elements on a single chip. The SOC method can increase the density of the element, but there is a limit to the elements that are integrated. For example, a Si device cannot integrate an element of a different type of devices such as GaAs because the device fabrication process is incompatible. Furthermore, the SOC takes long time for designing and realizing a new element, which increases device development costs.

On the other hand, with the SIP method, multiple LSI chips and MEMS chips are individually prepared, and then integrated on an interposer circuit board. In the SIP, there is no limit to the elements incorporated because the elements are individually prepared. Furthermore, in the case that a new system is developed, a conventional chip can be used so that the period of time required for designing can be reduced and device development costs can be reduced accordingly. However, the packaging density depends on the interposer circuit board on which the LSI chips and MEMS chips are mounted, and thus it is difficult to increase the device packaging density.

To solve the above problem, JP-A 2007-260866 (KOKAI), for example, suggests that LSIs and MEMS prepared by individual producing techniques are diced into chips after inspection and screening and then the chips are realigned side by side and redistributed into a MEMS integrated wafer. The redistributed MEMS wafer brings manufacturing costs down by allowing for the integration of elements of various types prepared by different producing processes and realigning on a large area only the operation elements that have passed the inspection. In addition, the LSIs and MEMS on the redistributed MEMS wafer are electrically connected to one another by a fine wiring layer. The pseudo-SOC technology, with which the LSIs and MEMS are realigned at a chip level and redistributed as an MEMS integrated wafer, can offer a high packaging density that the conventional SIP could never achieve and integration of different-type elements that the conventional SOC could never achieve.

With the pseudo-SOC technology, however, when a pseudo-SOC chip is mounted on the circuit wiring board by flip-chip technique, the pseudo-SOC chip may become deformed due to a difference between the coefficient of thermal expansion of the circuit wiring board and the pseudo-SOC chip. Then, an organic resin that insulates and supports the elements of different types may be broken. More specifically, a displacement difference appears due to the difference between the coefficient of thermal expansion of the pseudo-SOC chip flip-chip mounted by use of bump electrodes arranged on the periphery of the pseudo-SOC chip and the circuit wiring board that mounts the pseudo-SOC chip. This displacement difference causes a warp in the pseudo-SOC chip, and the organic resin that is provided between the different-type devices of the pseudo-SOC chip eventually is broken by stress. The main cause of the breakage is that I/O electrodes are arranged on the periphery of the pseudo-SOC chip to reduce the parasitic capacity by not arranging bump electrodes on the semiconductor element and to alleviate the bump electrode pitch.

SUMMARY OF THE INVENTION

According to one aspect of the present invention, an integrated semiconductor device includes a plurality of semiconductor elements having different integrated element circuits or different sizes; an insulating material arranged between the semiconductor elements; an organic insulating film arranged entirely on the semiconductor elements and the insulating material; a fine thin-layer wiring that arranged on the organic insulating film and connects the semiconductor elements; a first input/output electrode arranged on an area of the insulating material; and a first bump electrode formed on the first input/output electrode.

DETAILED DESCRIPTION OF THE INVENTION

Figure 1:
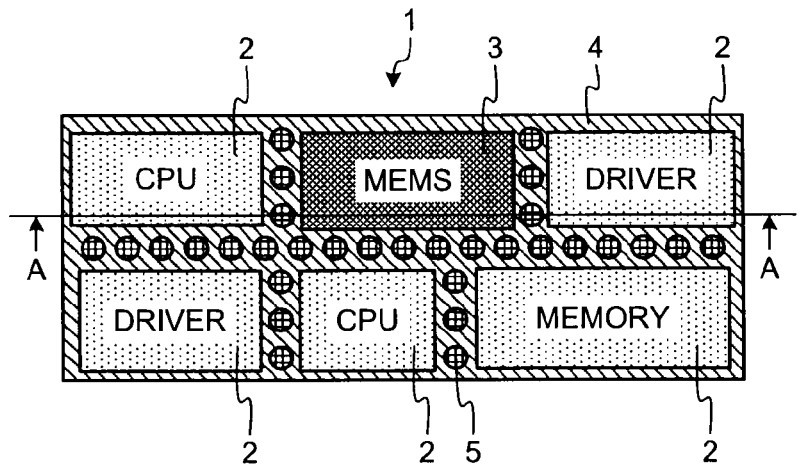
FIG. 1 is a top view of an integrated semiconductor device according to an embodiment of the present invention.

Exemplary embodiments of the present invention are explained below in detail with reference to the attached drawings. For the sake of convenience, the components in the drawings may be described on different scales. It also should be noted that in FIG. 1, LSI chips 2, a MEMS chip 3, and an insulating material 4 included in an integrated semiconductor device 1, as well as bump electrodes 5 on the surface of the integrated semiconductor device 1 are illustrated in solid lines for the sake of convenience.

Figure 2:
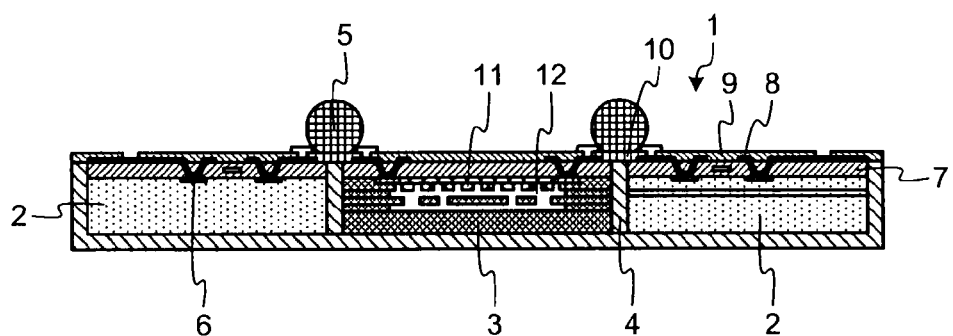
FIG. 2 is a sectional view of the device of FIG. 1 when sectioned along A-A.

As indicated in FIGS. 1 and 2, the integrated semiconductor device (pseudo-SOC chip) 1 is prepared by rearranging the LSI chips 2 and the MEMS chip 3 at chip level and redistributing them as a MEMS integrated wafer by use of pseudo-SOC technology. A wiring board (interposer substrate) that electrically interconnects the LSI chips 2, the MEMS chip 3 and the like to one another is not provided in such a structure. In practice, the integrated semiconductor device (pseudo-SOC chip) 1 is formed by dicing a pseudo-SOC wafer, which is a MEMS integrated wafer, into individual chips. The integrated semiconductor device (pseudo-SOC chip) 1 includes the LSI chips 2, the MEMS chip 3, the insulating material 4, the bump electrodes 5, contact portions (contact via) 6, an organic insulating film 7, a fine thin-layer wiring (global layer) 8, an organic insulating film 9, I/O electrodes 10, a MEMS encapsulating material 11, and MEMS cavities 12.

The LSI chips 2 are obtained by testing and screening on a wafer on which LSI semiconductor elements are formed and dicing the wafer into chips The MEMS chip 3 is obtained by testing and screening on a wafer on which MEMS electro mechanical elements are formed and dicing the wafer into chips. In the example of FIGS. 1 and 2, the integrated semiconductor device (pseudo-SOC chip) 1 carries five LSI chips 2 (two CPUs, two drivers, and one memory) and one MEMS chip 3. The LSI chips 2 are elements of a different type from the MEMS chip 3. The above structure is adopted here for the sake of explanation, but the numbers of LSI chips 2 and MEMS chips 3 mounted on the integrated semiconductor device (pseudo-SOC chip) 1 are not limited to this example.

The insulating material 4 is arranged between each of the LSI chips 2 and the MEMS chip 3, and if necessary, beneath the LSI chips 2 and the MEMS chip 3 and in the periphery of the integrated semiconductor device (pseudo-SOC chip) 1. The insulating material 4 thereby insulates the LSI chips 2 and the MEMS chip 3 from one another and fixes these chips to one another. The insulating material 4 is formed of an organic resin. More specifically, it is preferable that at least one of epoxy resin, polyimide resin, and benzocyclobutene (BCB) that contain a silica filler be included.

The bump electrodes 5 electrically and mechanically connect the integrated semiconductor device (pseudo-SOC chip) 1 to a circuit wiring board 200, which will be described later. The bump electrodes 5 are positioned on the top surface of the insulating material 4 between the LSI chips 2 and the MEMS chip 3 of the integrated semiconductor device (pseudo-SOC chip) 1, or more specifically, on the top surface of the I/O electrodes 10 formed in the area of the insulating material 4. Depending on the design, the organic insulating film 7, the fine thin-layer wiring 8, and the organic insulating film 9 may be formed between the bump electrodes 5 (I/O electrodes 10) and the insulating material 4. No matter what the design is, the bump electrodes 5 (I/O electrodes 10) should be always positioned above the insulating material 4 according to the present invention. It is preferable that these bump electrodes 5 be formed of metal containing at least one of Ti, Ni, Al, Cu, Au, Ag, Pb, Sn, Pd, and W, or an alloy of any of these metals.

The contact portions 6 are provided on the top surfaces of the LSI chips 2 and the MEMS chip 3 to establish an electrical connection between the LSI chips 2 and the fine thin-layer wiring 8 and also between the MEMS chip 3 and the fine thin-layer wiring 8.

The organic insulating film 7 electrically insulates the LSI chips 2 and the MEMS chip 3 from the fine thin-layer wiring 8. The organic insulating film 7 is disposed on the LSI chips 2 except for their contact portions 6 and on the MEMS chip 3 except for its contact portions 6. The organic insulating film 7 may be formed of polyimide resin.

The fine thin-layer wiring 8 is provided on the top surfaces of the contact portions 6 and the organic insulating film 7 to establish an electrical connection between the LSI chips 2 and the MEMS chip 3. In particular, it is preferable that the fine thin-layer wiring 8 be formed of metal containing at least one of Ti, Ni, Al, Cu, Au, Pb, Sn, Pd, and W, or an alloy of any of these metals.

The organic insulating film 9 is provided on the top surface of the fine thin-layer wiring 8 except for the area in which the I/O electrodes 10 are formed to protect the fine thin-layer wiring 8. The organic insulating film 9 may be formed of polyimide resin. It should be noted that, depending on the design, multiple layers of the fine thin-layer wiring 8 and the organic insulating film 9 may be deposited as multi-layered wirings on the organic insulating film 7 instead of one layer each for the fine thin-layer wiring 8 and the organic insulating film 9.

The I/O electrodes 10 are provided on the top surface of the fine thin-layer wiring 8 to form the bump electrodes 5 thereon and thereby electrically connect the bump electrodes 5 to the fine thin-layer wiring 8. More specifically, the I/O electrodes 10 are provided on the area of the insulating material 4 between the LSI chips 2 and the MEMS chip 3 of the integrated semiconductor device (pseudo-SOC chip) 1. The I/O electrodes 10 may not be fully deposited on the area of the insulating material 4 and may be positioned partially on the fine thin-layer wiring 8 and the organic insulating film 7. However, the I/O electrodes 10 are always deposited above the area of the insulating material 4 between the LSI chips 2 and the MEMS chip 3. For the bump electrodes 5 formed on the I/O electrodes 10, Cu/Ni/Ti or Cu/Ti may be used as barrier metal.

The MEMS encapsulating material 11 seals the MEMS movable portion of the MEMS chip 3, and the MEMS cavities 12 are openings surrounded by the MEMS chip 3 and the MEMS encapsulating material 11, in which the MEMS movable portion is provided.

Figure 3:
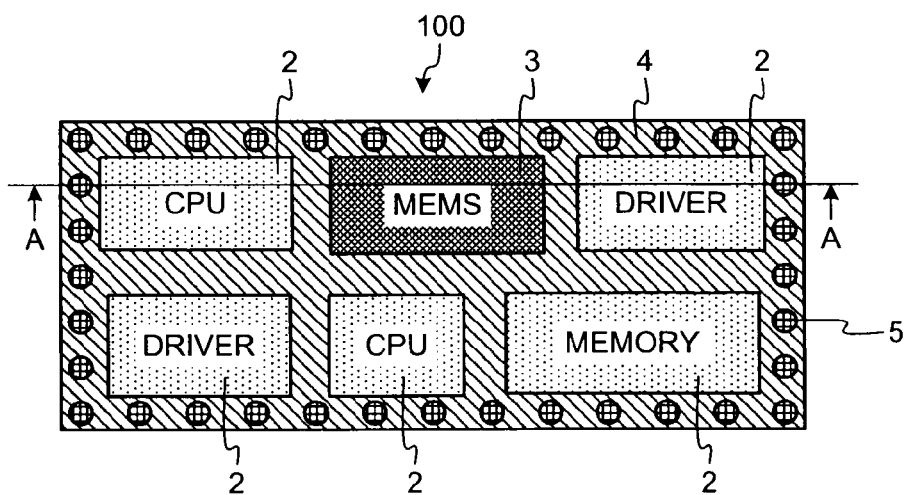
FIG. 3 is a top view of a conventional integrated semiconductor device.

The above arrangement of the integrated semiconductor device (pseudo-SOC chip) 1 is explained below in comparison with the arrangement of a conventional integrated semiconductor device. In FIG. 3, the LSI chips 2, the MEMS chip 3, and the insulating material 4 provided in a conventional integrated semiconductor device (pseudo-SOC chip) 100, as well as the bump electrodes 5 on the integrated semiconductor device (pseudo-SOC chip) 100, are illustrated in solid lines for the sake of convenience.

Figure 4:
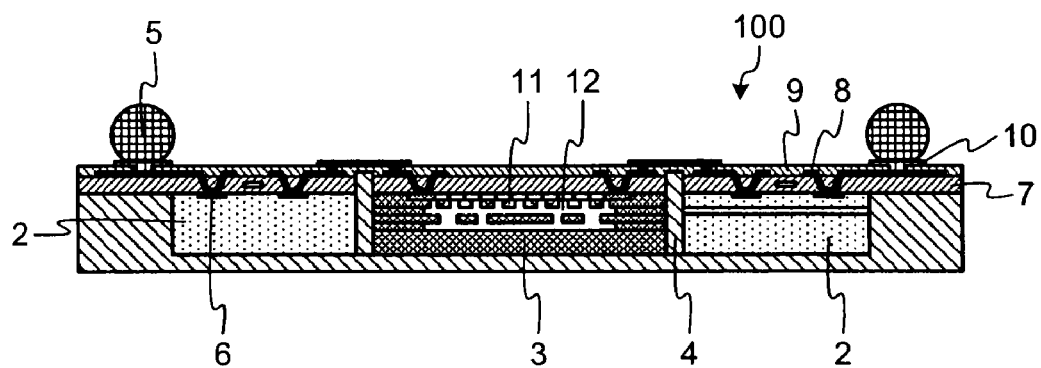
FIG. 4 is a sectional view of the device of FIG. 3 when sectioned along A-A.

In a similar manner to the integrated semiconductor device (pseudo-SOC chip) 1 according to the present embodiment, the conventional integrated semiconductor device (pseudo-SOC chip) 100 includes the LSI chips 2, the MEMS chip 3, the insulating material 4, the bump electrodes 5, the contact portions 6, the organic insulating film 7, the fine thin-layer wiring 8, the organic insulating film 9, the I/O electrodes 10, the MEMS encapsulating material 11, and the MEMS cavities 12, as illustrated in FIGS. 3 and 4.

A difference between this conventional integrated semiconductor device (pseudo-SOC chip) 100 and the integrated semiconductor device (pseudo-SOC chip) 1 resides in the positions of the I/O electrodes 10 (bump electrodes 5). As described above, the integrated semiconductor device (pseudo-SOC chip) 1 has the I/O electrodes 10 (bump electrodes 5) above the area of the insulating material 4 between the LSI chips 2 and the MEMS chip 3 of the integrated semiconductor device (pseudo-SOC chip) 1. In contrast, the integrated semiconductor device (pseudo-SOC chip) 100 has the I/O electrodes 10 (bump electrodes 5) only above the area of the insulating material 4 on the periphery of the integrated semiconductor device (pseudo-SOC chip) 100. In other words, the I/O electrodes 10 (bump electrodes 5) are not arranged above the area of the insulating material 4 between the LSI chips 2 and the MEMS chip 3.

Figure 5:
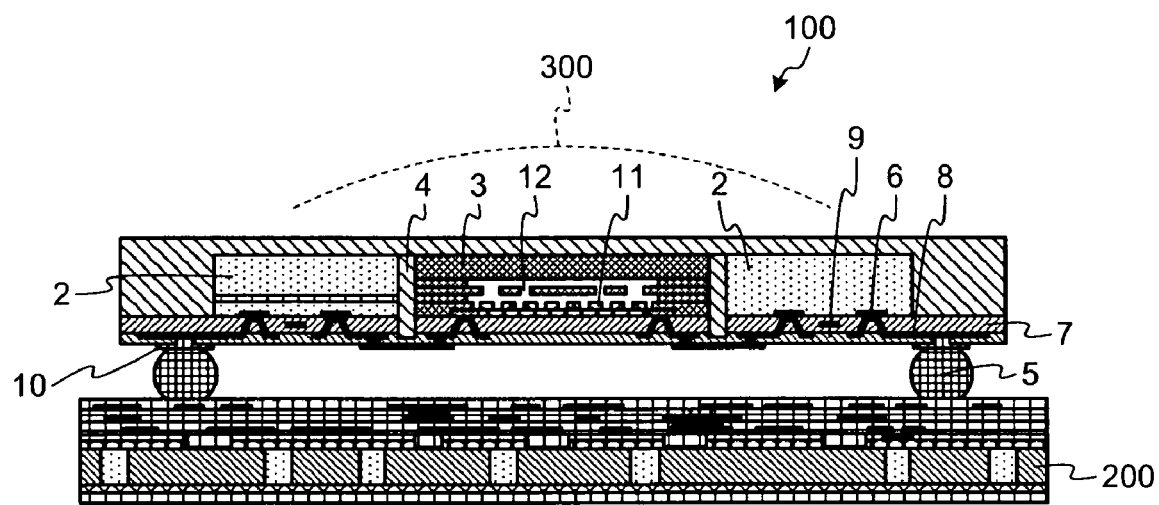
FIG. 5 is a sectional view of the conventional semiconductor device flip-chip mounted on a circuit wiring board.

The flip-chip assembly of the conventional integrated semiconductor device (pseudo-SOC chip) 100 onto the circuit wiring board 200 is now explained. In this assembly, a displacement difference is created between the conventional integrated semiconductor device (pseudo-SOC chip) 100 and the circuit wiring board 200 illustrated in FIG. 5, due to a difference between the coefficient of thermal expansion of the integrated semiconductor device and the circuit wiring board. In particular, because the I/O electrodes 10 (bump electrodes 5) that are in contact with the circuit wiring board 200 are arranged on the top surface of the insulating material 4 on the periphery of the integrated semiconductor device (pseudo-SOC chip) 100, warping (stress deformation) 300 occurs in the integrated semiconductor device (pseudo-SOC chip) 100. This causes breakage of the portion of the insulating material 4 between the LSI chips 2 and the MEMS chip 3 of the integrated semiconductor device (pseudo-SOC chip) 100.

Next, the flip-chip assembly of the integrated semiconductor device (pseudo-SOC chip) 1 according to the present embodiment onto the circuit wiring board 200 is explained. There is a difference between the coefficient of thermal expansion of the integrated semiconductor device (pseudo-SOC chip) 1 and the circuit wiring board 200 illustrated in FIG. 6, which causes a displacement difference between the integrated semiconductor device and the circuit wiring board. However, the I/O electrodes 10 (bump electrodes 5) connected to the circuit wiring board 200 are provided on the top surface of the portion of the insulating material 4 between the LSI chips 2 and the MEMS chip 3 of the integrated semiconductor device (pseudo-SOC chip) 1. Thus, the warping (stress deformation) 300 in the integrated semiconductor device (pseudo-SOC chip) 1 is effectively suppressed. The problem of the breakage of the insulating material 4 corresponding to the area between the LSI chips 2 and the MEMS chip 3 of the integrated semiconductor device (pseudo-SOC chip) 1 can be thereby solved. Hence, the integrated semiconductor device (pseudo-SOC chip) 1 according to the present embodiment improves the reliability of the connection to the circuit wiring board 200 on which the integrated semiconductor device is flip-chip assembled.

For the circuit wiring board 200, the substrate described in U.S. Pat. No. 4,811,082 or a printed surface laminar circuit (SLC) board having an insulating layer and a conductive layer built up on a conventional glass epoxy substrate may be adopted. Furthermore, a publicly known flexible board formed mainly of polyimide resin with copper wiring thereon may also be adopted. The circuit wiring board 200 of the electronic circuit device is not specifically limited.

The method of manufacturing the integrated semiconductor device according to the present embodiment is now explained. FIGS. 7A to 7M are sectional views of the integrated semiconductor device (pseudo-SOC chip) 1 according to the present embodiment in the manufacturing process. These drawings correspond to the device in FIG. 1 when sectioned along A-A.

Figure 7A:
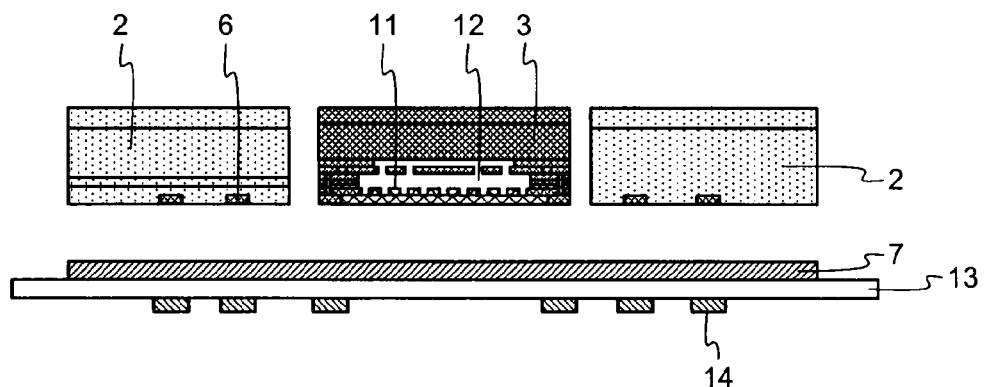
FIGS. 7A to 7M are sectional views of the integrated semiconductor device according to the present embodiment in the manufacturing process.

First, as illustrated in FIG. 7A, the LSI chips 2, the MEMS chip 3, and a glass mask (integrated transfer board) 13 are prepared. The organic insulating film 7 that has different adhesive strengths is deposited on the surface of the glass mask 13 on which the LSI chips 2 and the MEMS chip 3 are mounted. A fine wiring pattern 14 is formed on the other side of the glass mask 13. For the sake of explanation, a photosensitive polyimide resin (Toray UR3140) is used as the organic insulating film 7 in this example.

Figure 7B:
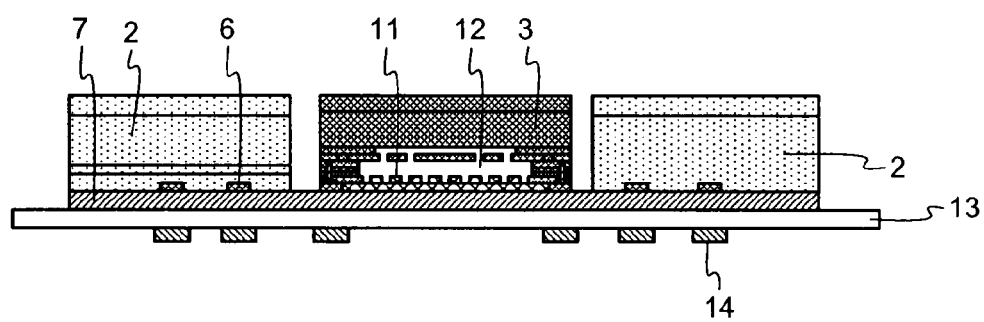

Next, in FIG. 7B, the LSI chips 2 and the MEMS chip 3 are mounted on the glass mask 13 in such a manner that the surfaces (bottom side in the drawing) of the LSI chips 2 are flush with the surface of the MEMS chip 3. In actuality, a large number of LSI chips 2 and MEMS chips 3 are arranged on the glass mask 13, constituting a pseudo-SOC wafer altogether.

Figure 7C:
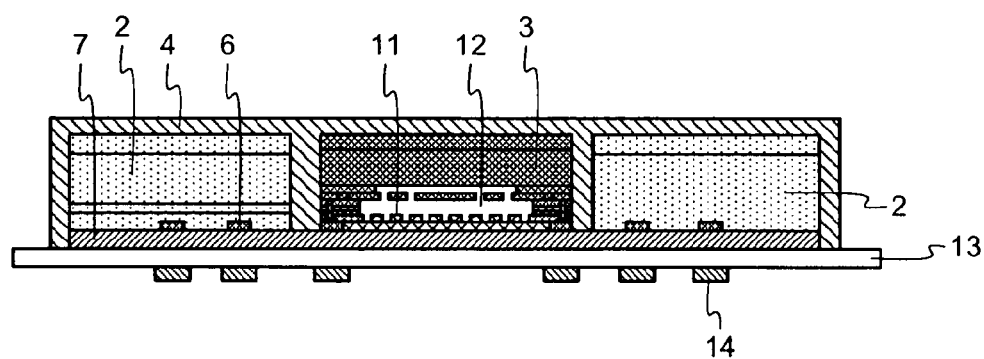

In FIG. 7C, the backs (top side in the drawing) of the LSI chips 2 and the MEMS chip 3 are coated with the insulating material 4. For the sake of explanation in this example, an epoxy resin containing a silica filler is adopted for the insulating material 4. It is preferable to employ the vacuum printing technique in the coating of the insulating material 4 because the insulating material 4 should be deposited in minute areas between the semiconductor elements without any void.

Figure 7D:
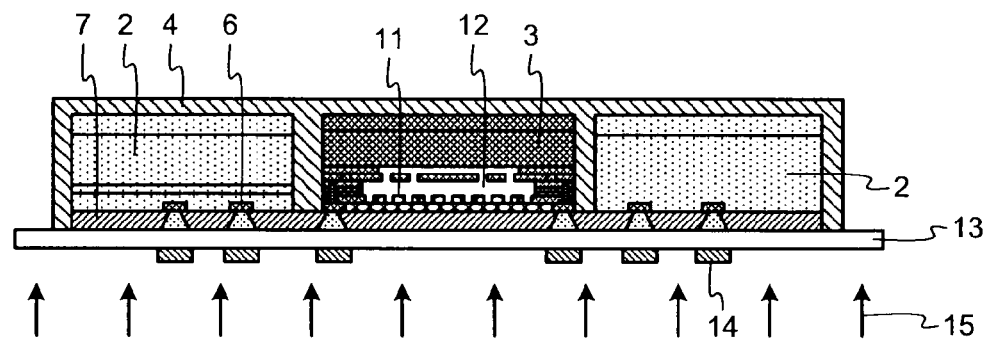

Thereafter, as illustrated in FIG. 7D, the LSI chips 2 and the MEMS chip 3 are aligned on the glass mask 13, and the structure with these chips on is exposed to exposure energy 15 on the surface on which the fine wiring pattern 14 of the glass mask 13 is formed. The exposure amount should be adjusted in accordance with the sensitivity of the photosensitive resin adopted for the organic insulating film 7. With the polyimide resin (Toray UR 3140) in this example, the exposure amount is preferably 100 mJ/cm$^2$.

Figure 7E:
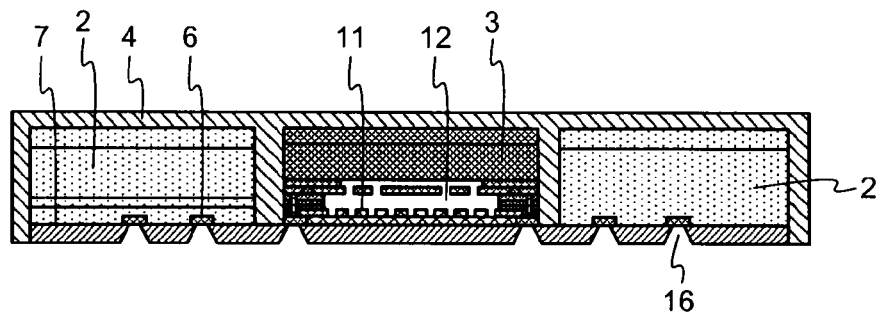

Next, in FIG. 7E, after the glass mask 13 is removed, a developing process is conducted so that openings are made selectively in the organic insulating film 7 deposited on the surface (bottom side in the drawing) of the contact portions 6 to form contact via holes 16. A developing solution (Toray DV-505) is used in the developing process. The surface (bottom side in the drawing) of the organic insulating film 7 of this example is flattened in the manufacturing process.

Figure 7F:
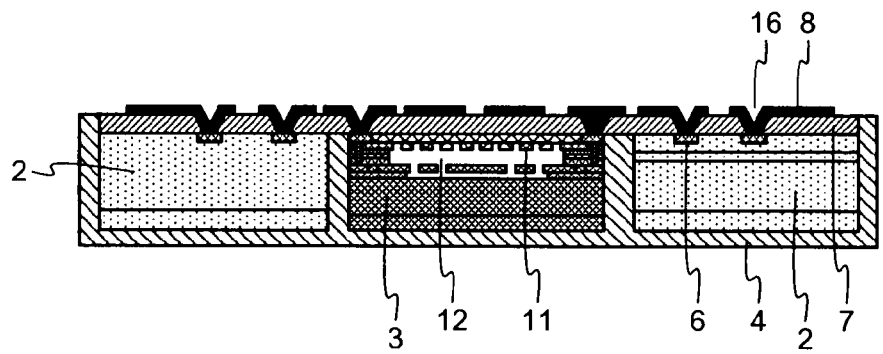

In FIG. 7F, the fine thin-layer wiring 8 is deposited the surface (top side in the drawing) of the organic insulating film 7 by any known technique such as electron beam (EB) evaporation or sputtering. The fine thin-layer wiring 8 is thereby electrically connected, through the contact via holes 16, to the contact portions 6, or in other words the LSI chips 2 and the MEMS chip 3. In this example, Al/Ti is used for the fine thin-layer wiring 8. Because the surface (top side in the drawing) of the organic insulating film 7 is flattened, a problem of the fine thin-layer wiring 8 being broken at an irregularity does not occur. Furthermore, because the layers deposited in the following processes also become flattened, the I/O electrodes 10 are formed flat. Hence, the bump electrodes 5 are formed on the I/O electrodes 10 with high accuracy.

Figure 7G:
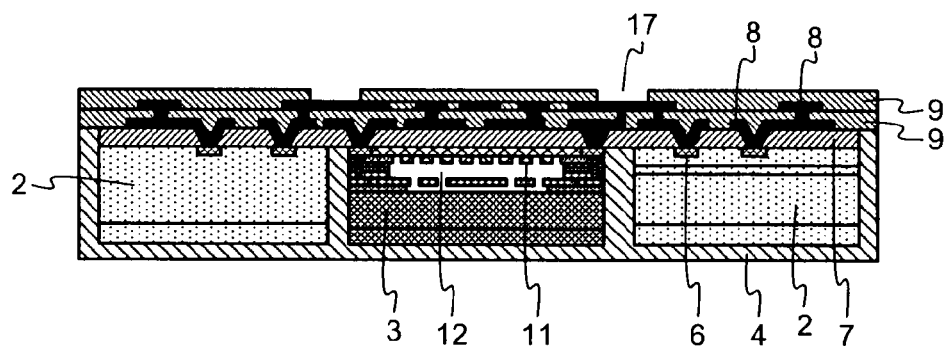

In FIG. 7G, the surface (top side in the drawing) of the fine thin-layer wiring 8 is coated with the organic insulating film 9 so that the fine thin-layer wiring 8 and the organic insulating film 9 are laminated. As a result, two layers each of the fine thin-layer wiring 8 and the organic insulating film 9 are formed on the organic insulating film 7. Further, openings 17 are formed in the outermost surface of the organic insulating film 9 (topmost layer in the drawing) to provide the I/O electrodes 10. Each of the openings 17 is 50 micrometers in diameter, and the fine thin-layer wiring 8 exposed from the openings 17 serves as part of the I/O electrodes 10. In this example, the organic insulating film 9 is formed of a photosensitive polyimide resin (Toray UR3140).

Figure 7H:
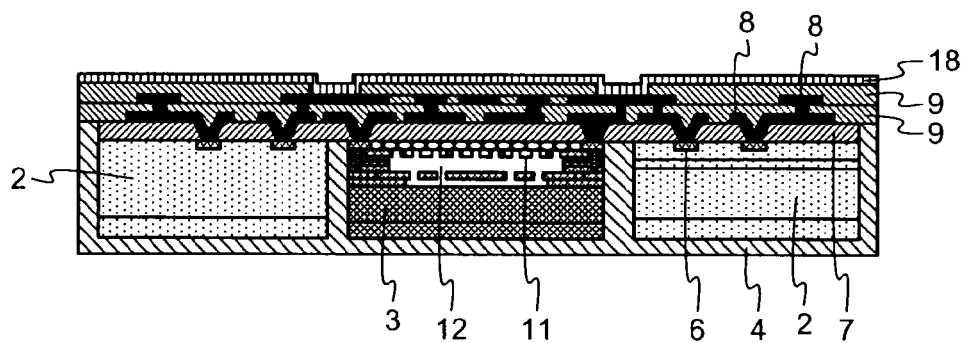

In FIG. 7H, the surface (top side in the drawing) of the organic insulating film 9 is coated with a Cu/Ti multi-level metal layer 18 by electron beam (EB) evaporation. The multi-level metal layer 18 has a multi-layer structure with a Cu layer deposited on the surface (top side in the drawing) of a Ti layer. The portions of the multi-level metal layer 18 formed in the openings 17 become part of the I/O electrodes 10 in the end, and serves as a barrier metal to the bump electrodes 5.

Figure 7I:
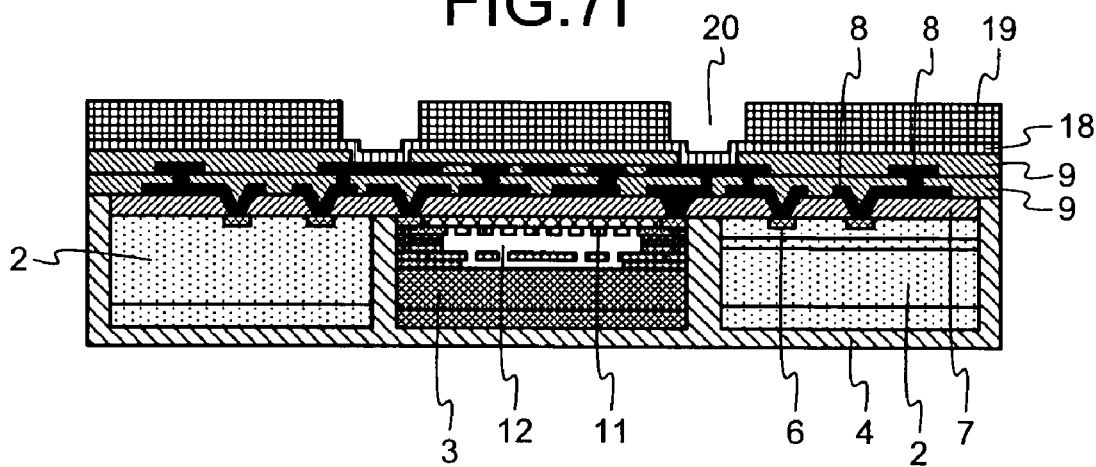

In FIG. 7I, a 50 micrometer-thick resist film 19 is spin-coated on the surface (top side in the drawing) of the multi-level metal layer 18, and openings 20 having a diameter of 80 micrometers, which is larger than that of the openings 17, are formed in the resist film 19 by exposure and development. The exposure is performed with an amount of energy sufficient for the thickness of the resist film 19, while the development is performed by use of a developing solution (Hoechst Japan, AZ400K developer) in this example. For the resist film 19, a thick film resist (Hoechst Japan, AZ4903) is employed.

Figure 7J:
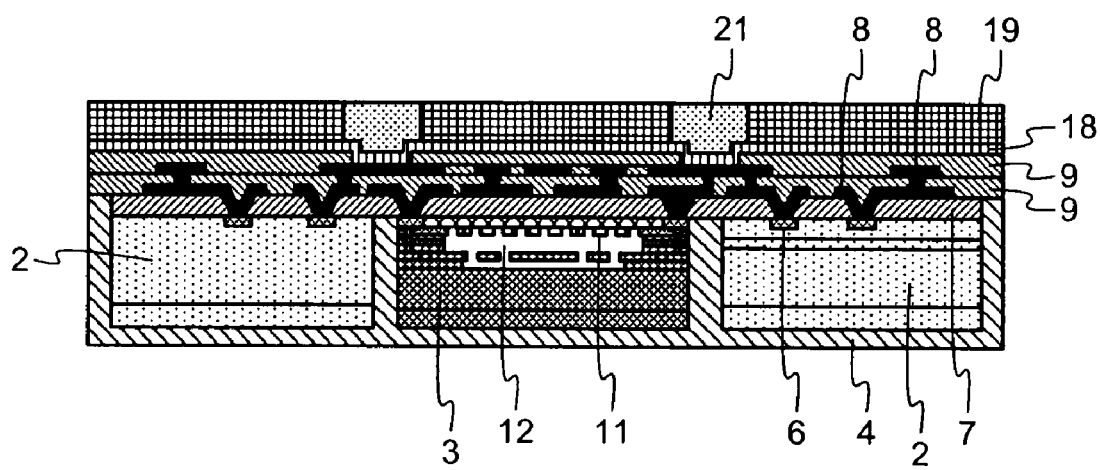

Next, as shown in FIG. 7J, the resultant pseudo-SOC wafer now has the openings 20 in the resist film 19 at positions that correspond to the I/O electrodes 10 (openings 17). This pseudo-SOC wafer is immersed and electroplated in a Pb/Sn plating solution (sulfonic acid soldering/plating solution) of the following composition in this example. The electroplating is conducted with the Cu/Ti layer as a cathode and a high-purity eutectic solder plate as an anode. The current density is between 1 and 4 A/dm$^2$, and the bath temperature is 25° C. The solution is gently stirred so that PbSn solder alloy 21 is deposited 50 micrometers on the multi-level metal layer 18 in the openings 20. The solder composition (Pb/Sn) here is substantially the same as the eutectic solder or shifted slightly toward either Pb or Sn. The PbSn solder alloy 21 becomes bump electrodes 5 at the end of the process.

Composition of Sulfonic acid Soldering/Plating Solution

| | |
|---|---|
| tin ions ($Sn^{2+}$) | 12 volume percent |
| lead ions ($Pb^{2+}$) | 30 volume percent |
| aliphatic sulfonic acid | 41 volume percent |
| nonionic surfactant | 5 volume percent |
| cationic surfactant | 5 volume percent |
| isopropyl alcohol | 7 volume percent |

Figure 7K:
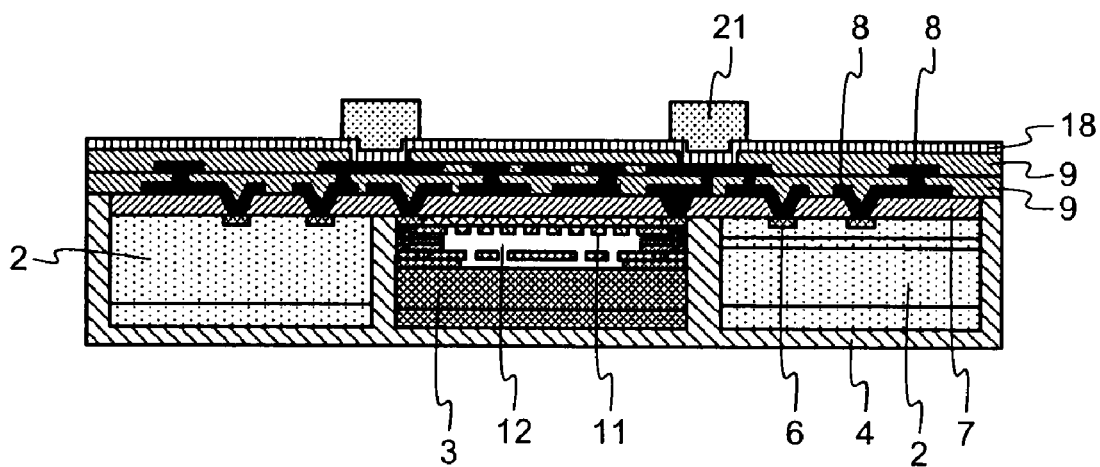

In FIG. 7K, the resist film 19 formed of AZ4903 to serve as a resist in the electroplating process is removed by use of acetone.

Figure 7L:
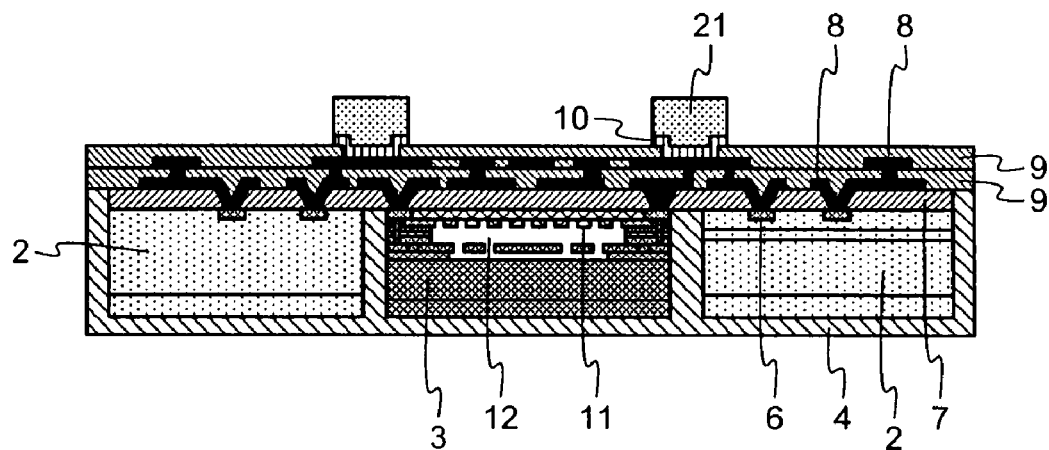

In FIG. 7L, to remove the multi-level metal layer 18, the Cu layer is etched off by immersion in a solution of citric acid/hydrogen peroxide, and then the Ti layer is etched off by immersion in a mixed solution of ethylene diamine tetraacetic acid/ammonia/hydrogen peroxide/purified water. As a result, the multi-level metal layer 18 is fully removed except for the portions on the back (bottom side in the drawing) of the PbSn solder alloy 21.

Figure 7M:
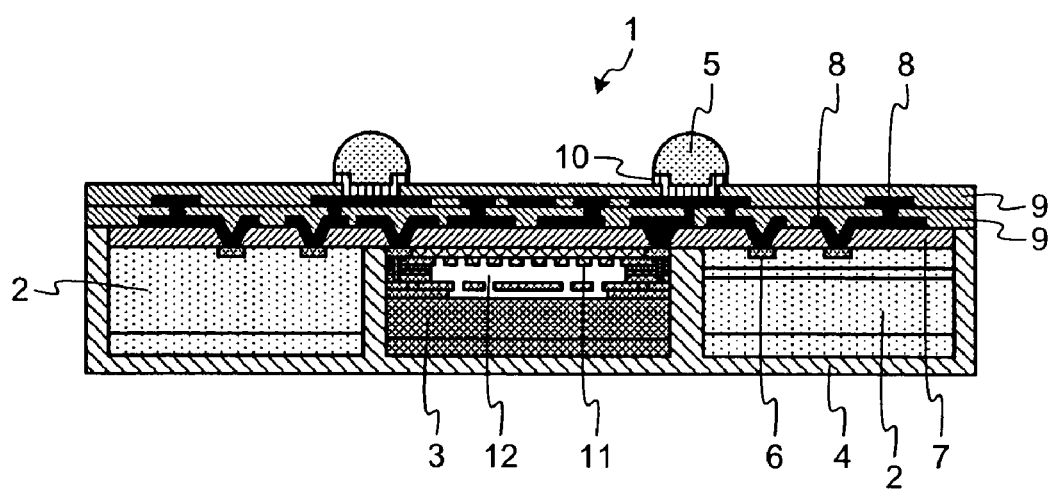

In FIG. 7M, the PbSn solder alloy 21 is shaped into the round bump electrodes 5 by subjecting the pseudo-SOC wafer to a reflow.

Finally, the pseudo-SOC wafer obtained through the above processing steps is diced into individual chips, and the integrated semiconductor device (pseudo-SOC chip) 1 is completed.

Explanation is now given about the method of flip-chip mounting the integrated semiconductor device (pseudo-SOC chip) 1 that is obtained by the manufacturing process explained with reference to FIGS. 7A to 7M, onto the circuit wiring board 200. In particular, the electrode terminals of the circuit wiring board 200 and the bump electrodes 5 of the integrated semiconductor device (pseudo-SOC chip) 1 are aligned by use of a flip-chip bonder of a known technology that is provided with a half mirror for alignment. The integrated semiconductor device (pseudo-SOC chip) 1 is held by a collet that has a heating mechanism, and is preheated in an atmosphere of nitrogen at 350° C.

Figure 6:
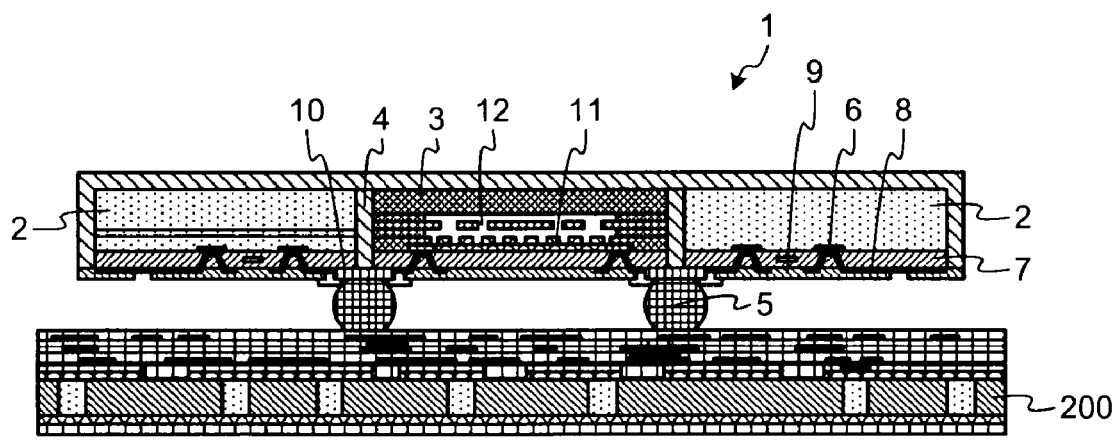
FIG. 6 is a sectional view of the integrated semiconductor device according to the present embodiment that is flip-chip mounted on a circuit wiring board.

Next, the collet is lowered with the bump electrodes 5 of the integrated semiconductor device (pseudo-SOC chip) 1 brought in contact with the electrode terminals of the circuit wiring board 200 to apply pressure of 30 kg/mm$^2$. The temperature is then raised to 370° C. to melt the solder so that the integrated semiconductor device (pseudo-SOC chip) 1 is adhered to the electrode terminals of the circuit wiring board 200. Through the above processing steps, the integrated semiconductor device (pseudo-SOC chip) 1 is flip-chip mounted on the circuit wiring board 200 as illustrated in FIG. 6.

If necessary, a encapsulating resin may be provided into a gap between the integrated semiconductor device (pseudo-SOC chip) 1 and the circuit wiring board 200 in accordance with a known technique. As a encapsulating resin, an epoxy resin may be used, which contains a bisphenol-type epoxy, an imidazole curing catalyst, an acid anhydride curing agent, and 45 wt % of a spherical quartz filler.

Furthermore, a molten epoxy resin may be employed, which is prepared by pulverizing, mixing, and melting 100 parts by weight of cresol novolac-type epoxy resin (Sumitomo Chemical Co., Ltd., ECON-195XL), 54 parts by weight of phenol resin as a curing agent, 100 parts by weight of molten silica as a filler, 0.5 parts by weight of benzyldimethylamine as a catalyst, 3 parts by weight of carbon black as another additive, and 3 parts by weight of silane coupling agent. The materials are not specifically limited thereto.

The connection reliability of the above flip-chip assembly of the integrated semiconductor device (pseudo-SOC chip) 1 obtained by the manufacturing method explained with reference to FIGS. 7A to 7M onto the circuit wiring board 200 is discussed below in comparison with the connection reliability of the above flip-chip assembly of the conventional integrated semiconductor device (pseudo-SOC chip) 100 onto the circuit wiring board 200.

More specifically, samples of two types were compared to make evaluations regarding their connection reliability. Samples of one type were prepared by flip-chip mounting the conventional integrated semiconductor device (pseudo-SOC chip) 100 that includes 256 bump electrodes 5 in an area of 20 millimeters×5 millimeters onto the circuit wiring board 200, while sample of the other type were prepared by flip-chip mounting the integrated semiconductor device (pseudo-SOC chip) 1 that includes 256 bump electrodes 5 in an area of 20 millimeters×5 millimeters onto the circuit wiring board 200. A thousand samples were tested for each type under the temperature cycling condition of −55° C. (30 minutes) to 25° C. (5 minutes) to 125° C. (30 minutes) to 25° C. (5 minutes). If any of the 256 pins becomes disconnected, the device was determined as faulty.

As a result of the test, after 1500 cycles, breakage of the insulating material 4 provided between the LSI chips 2 and the MEMS chip 3 under stress was found in 100% of the conventional integrated semiconductor devices (pseudo-SOC chip) 100.

On the other hand, in the integrated semiconductor device (pseudo-SOC chip) 1 according to the present embodiment, no breakage was observed after 3000 cycles in the insulating material 4 provided between the LSI chips 2 and the MEMS chip 3. This shows remarkable improvements in the connection reliability.

Figure 8:
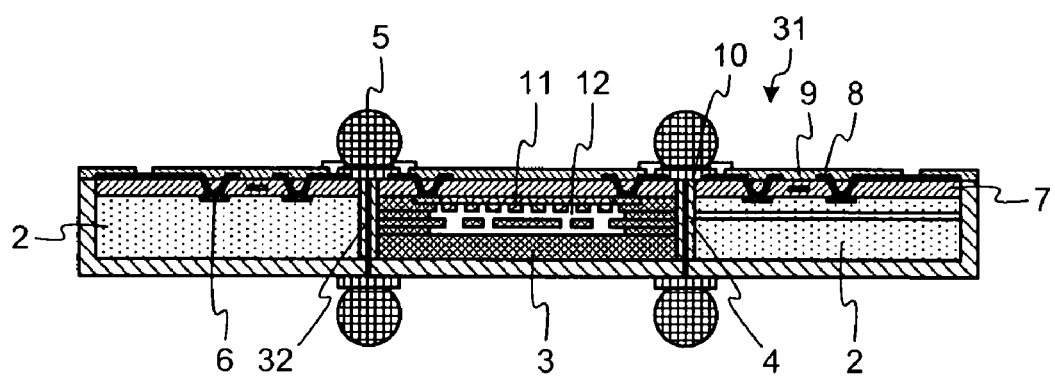
FIG. 8 is a sectional view of an integrated semiconductor device according to a modification of the present embodiment.

A modification of the present embodiment is given below. As illustrated in FIG. 8, an integrated semiconductor device (pseudo-SOC chip) 31 is different from the integrated semiconductor device (pseudo-SOC chip) 1 in that the bump electrodes 5 and the I/O electrodes 10 are provided not only on the top surface of (immediately above) the portion of the insulating material 4 between the LSI chips 2 and the MEMS chip 3 of the integrated semiconductor device (pseudo-SOC chip) 31 but also on the back surface of (immediately beneath) the portion. The I/O electrodes 10 on the top surface are connected to the I/O electrodes 10 on the back surface by way of through-hole wiring 32 provided therebetween.

For this reason, the through-hole wiring 32 connecting to the I/O electrodes 10 on the top and back surfaces of the insulating material 4 to each other is formed linearly in the insulating material 4. This means that no vertical through hole has to be made in the LSI chips 2 and the MEMS chip 3 in a roundabout manner. Thus, when compared with the device having through holes in the semiconductor substrates of the LSI chips 2 and the MEMS chip 3, the integrated semiconductor device (pseudo-SOC chip) 31 provided with the I/O electrodes 10 on the two surfaces (top and bottom surfaces) thereof can be fabricated at lower cost. In addition, because of the bump electrodes arranged on the I/O electrodes 10, the integrated semiconductor device (pseudo-SOC chip) 31 can be readily laminated together with other integrated semiconductor devices (pseudo-SOC chip) or other electronic devices in a three-dimensional manner.

According to the present embodiment, the I/O electrodes of the integrated semiconductor device, which is a pseudo-SOC chip, are arranged on the top surface of the insulating material with which the elements of different types are secured to one another. Further, the integrated semiconductor device is secured onto the circuit wiring board by the bump electrodes provided on the I/O electrodes. Due to such a structure, the stress deformation of the integrated semiconductor device caused by a difference between the coefficient of thermal expansion of the integrated semiconductor device and the circuit wiring board can be avoided. Thus, no breakage occurs in the portion of the insulating material between the elements of the different types, and the connection reliability can be readily improved.

According to the present invention, the I/O electrodes of the integrated semiconductor device, which is a pseudo-SOC chip, are arranged on the top surface of the insulating material with which the elements of different types are secured to one another. Further, the integrated semiconductor device is secured onto the circuit wiring board by the bump electrodes provided on the I/O electrodes. Due to such a structure, the integrated semiconductor device is protected against stress deformation caused by a difference between the coefficient of thermal expansion of the integrated semiconductor device and the circuit wiring board. The present invention is therefore advantageous in that no breakage occurs in the portion of the organic resin insulating material between the elements of the different types, and that the connection reliability can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An integrated semiconductor device comprising:
    a plurality of semiconductor elements having different integrated element circuits or different sizes;
    an insulating material arranged between the semiconductor elements;
    an organic insulating film formed directly on the semiconductor elements and the insulating material;
    a fine thin-layer wiring formed directly on the organic insulating film and directly contacting the semiconductor elements;
    a plurality of first input/output electrodes; and
    a plurality of first bump electrodes, each of the first bump electrodes being respectively formed on one of the first input/output electrodes, wherein
    all of the first input/output electrodes are disposed only on an area of the insulating material.

2. The device according to claim 1, wherein
    the insulating material includes a first surface on which the fine thin-layer wiring is formed, a second surface that opposes the first surface on a back surface of the integrated semiconductor device, and a through hole formed through the insulating material that connects the first surface and the second surface,
    the first input/output electrode is arranged on the first surface,
    a second input/output electrode is arranged on the second surface, and
    a conductive member formed in the through hole contacting the first and second input/output electrodes.

3. The device according to claim 1, wherein at least one of the semiconductor elements is an electromechanical element.

4. The device according to claim 1, wherein the device is flip-chip mounted on a circuit wiring board by use of the first bump electrode.

5. The device according to claim 2, wherein a second bump electrode is formed on the second input/output electrode.

6. The device according to claim 1, wherein the insulating material is formed of at least one of epoxy resin, polyimide resin, and benzocyclobutene (BCB) that contain at least a silica filler.

7. The device according to claim 1, wherein the first bump electrode is formed of a metal containing at least one of Ti, Ni, Al, Cu, Au, Ag, Pb, Sn, Pd, and W, or an alloy thereof.

8. An integrated semiconductor device comprising:
    an integrated circuit with two semiconductor elements separated by an insulating material;
    an organic insulating film formed over the two semiconductor elements;
    a wiring directly connected to at least one of the semiconductor elements;
    a plurality of input/output electrodes; and
    a plurality of first bump electrodes, each of the first bump electrodes being respectively formed on one of the input/output electrodes, wherein
    all of the input/output electrodes are arranged only on the insulating material disposed between the semiconductor elements, and electrically connected to the at least one wiring.

* * * * *